(12) United States Patent
Xiong et al.

(10) Patent No.: US 10,481,454 B1
(45) Date of Patent: Nov. 19, 2019

(54) THIN FILM TRANSISTOR ARRAY SUBSTRATE AND DISPLAY PANEL

(71) Applicant: Century Technology (Shenzhen) Corporation Limited, Shenzhen (CN)

(72) Inventors: Yuan Xiong, Shenzhen (CN); Ning Fang, Shenzhen (CN); Chih-Chung Liu, New Taipei (TW); Ming-Tsung Wang, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 16/170,463

(22) Filed: Oct. 25, 2018

(30) Foreign Application Priority Data

Jul. 5, 2018 (CN) .......................... 2018 1 0732347

(51) Int. Cl.
*G02F 1/1362* (2006.01)
*G02F 1/1343* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *G02F 1/134363* (2013.01); *G02F 2001/13629* (2013.01); *G02F 2201/121* (2013.01); *G02F 2201/123* (2013.01); *H01L 27/124* (2013.01); *H01L 27/1255* (2013.01)

(58) Field of Classification Search
CPC ............ G02F 1/134363; G02F 1/1368; G02F 2001/13629; G02F 2201/121; G02F 2201/123; H01L 27/124; H01L 27/1255
See application file for complete search history.

(56) References Cited

U.S. PATENT DOCUMENTS

2011/0267572 A1* 11/2011 Chen ................. G02F 1/136286
349/143
2018/0239210 A1* 8/2018 Yabuki ............. G02F 1/133345

FOREIGN PATENT DOCUMENTS

TW          201140209 A    11/2011
TW          I468826 B      1/2015

* cited by examiner

*Primary Examiner* — Nathanael R Briggs
(74) *Attorney, Agent, or Firm* — ScienBiziP, P.C.

(57) ABSTRACT

A thin film transistor array substrate with always-equal parasitic capacitances for a display includes scan lines, data lines, common lines, and pixel units. First and second scan lines extend in a first direction. Data and common lines extend in a second intersecting direction and are arranged to alternate in the first direction. First and second sub-pixels of pixel units are distributed on either side of and connected to one of a scan line pair. The first and second sub-pixels also straddle and connect to one data line. Bridges on a common line cover a portion of one scan line pair in the second direction and each bridge overlaps first and second scan lines. First scan line overlap with bridge is equal to second scan line overlap. A display panel using the thin film transistor array substrate is also provided.

20 Claims, 4 Drawing Sheets

THIN FILM TRANSISTOR ARRAY SUBSTRATE AND DISPLAY PANEL

FIELD

The subject matter herein generally relates to a thin film transistor array substrate and a display panel using the thin film transistor array substrate.

BACKGROUND

Dual gates in a thin film transistor array substrate can reduce a number of data lines, thus data signal driving chip, and its cost, can be reduced. In a conventional thin film transistor array substrate, scan lines are usually made of a first conductive layer, common lines are made of a second conductive layer. The common line overlaps with two adjacent scan lines to form two equal parasitic capacitances.

However, if there is an offset between the first conductive layer and the second conductive layer during the fabrication process, the common line and the adjacent two scan lines have different overlapping areas, resulting in unequal capacitance values of the parasitic capacitances. Thus, the charging rates of two adjacent columns of pixels are affected. If there are differences in the charging rates of the two adjacent columns of pixels, the display panel will include bright and dark stripes, and the display quality may be greatly reduced, especially in high-resolution products.

Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
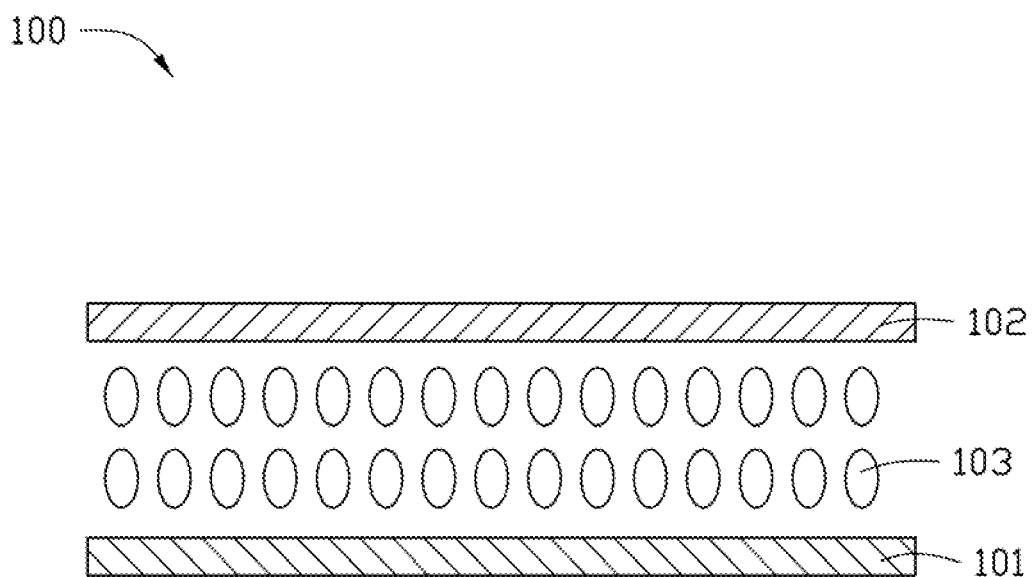
FIG. 1 is a cross-sectional view showing an embodiment of a display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

FIG. 1 shows an embodiment of a display panel 100. The display panel 100 includes a color filter (CF) substrate 102, a liquid crystal layer 103, and a thin film transistor (TFT) substrate 101. The color filter substrate 102 and the thin film transistor array substrate 101 are on opposite sides of the liquid crystal layer 103, and the liquid crystal layer 103 is between the color filter substrate 102 and the thin film transistor array substrate 101.

Figure 2:
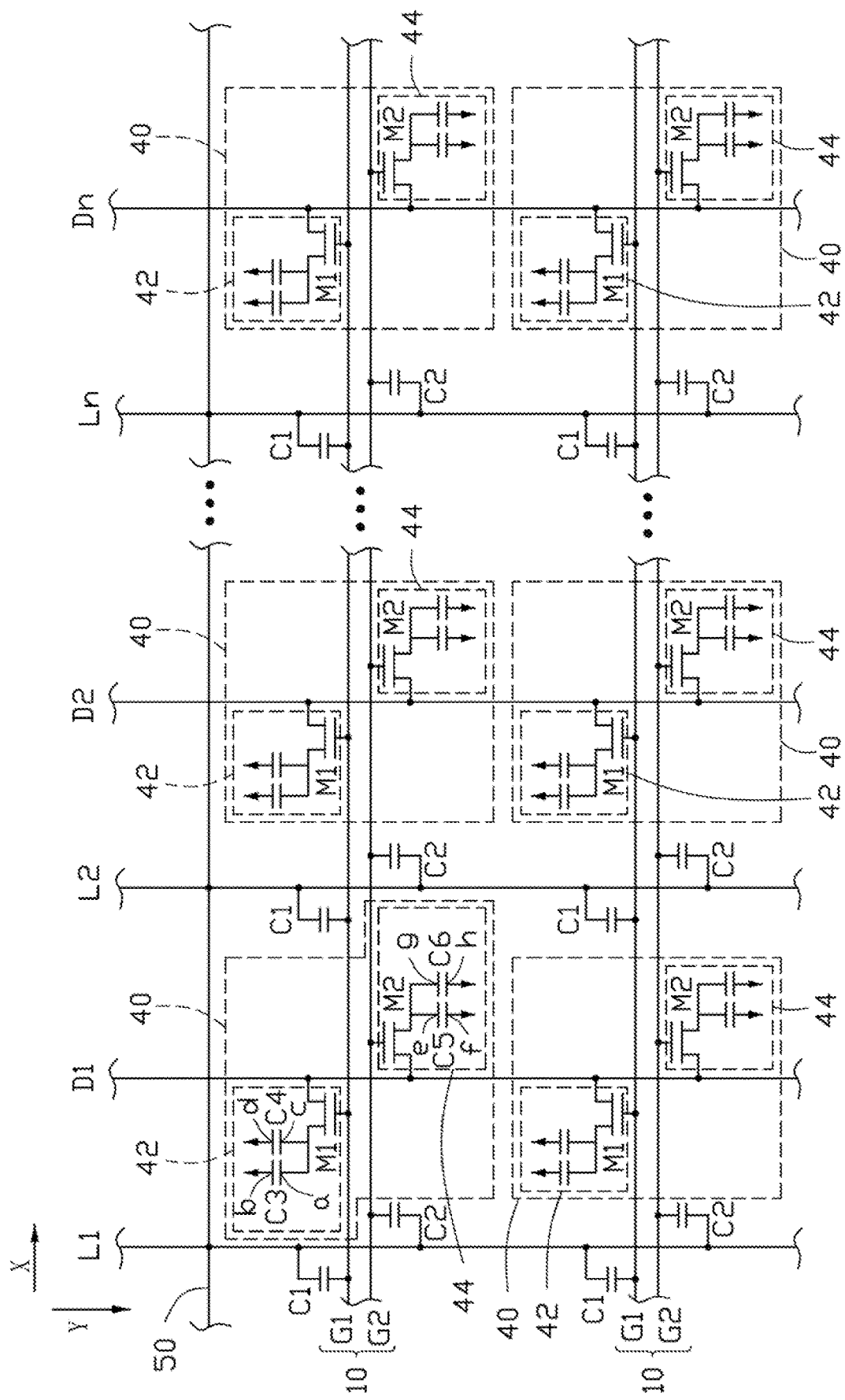
FIG. 2 is a circuit diagram showing a thin film transistor array substrate of the display panel of FIG. 1.

In FIG. 2, the thin film transistor array substrate 101 includes scan line pairs 10, data lines D1-Dn, and common lines L1-Ln, wherein n is an integer which is larger than or equal to 2. Each scan line 10 includes a first scan line G1 and a second scan line G2 both extending in a first direction X. Each data line and each common line extend in a second direction Y intersecting with the first direction X. The data lines D1-Dn and the common lines L1-Ln are alternately arranged in the first direction X.

In FIG. 2, the thin film transistor array substrate 101 further includes pixel units 40. Each pixel unit 40 is between two adjacent common lines L(n−1)-Ln. The pixel units 40 are arranged in a matrix of rows and columns. Each pixel unit 40 is electrically connected to one first scan line G1, one second scan line G2, one data line Dn, and one common line Ln. The pixel units 40 of one column share one data line Dn and one common line Ln.

Taking one pixel unit 40 as an example, the connection and positional relationship between the first scan line G1, the second scan line G2, the common line Ln, and the pixel unit 40 are as follows.

As shown in FIG. 2, each pixel unit 40 includes a first sub-pixel 42 and a second sub-pixel 44 on opposite sides of one pair of scan lines 10. The first sub-pixel 42 is electrically connected to the first scan line G1, the data line Dn, and the common line Ln. The second sub-pixel 44 is electrically connected to the second scan line G2, the data line Dn, and the common line Ln. The first sub-pixel 42 and the second sub-pixel 44 are on opposite sides of, and electrically connected to, one of the data lines D1-Dn.

Figure 4:
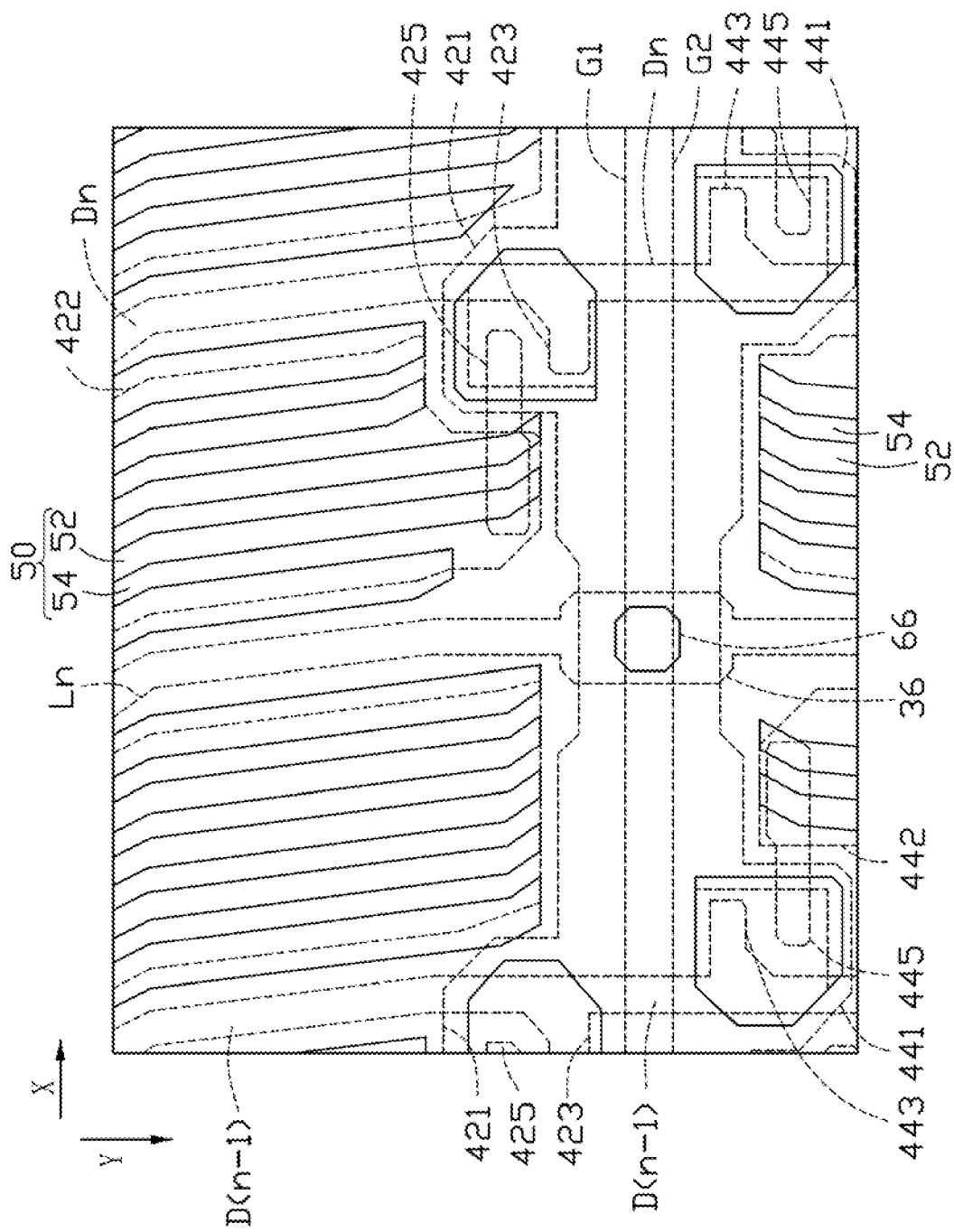
FIG. 4 is a plan view showing portion of the thin film transistor array substrate of FIG. 2.

In FIG. 2 and FIG. 4, the first sub-pixel 42 includes a first thin film transistor M1, a first sub-pixel electrode 422 (shown in FIG. 4), and a first liquid crystal capacitor C3 and a first storage capacitor C4. The first thin film transistor M1 includes a gate electrode 421 (shown in FIG. 4), a source electrode 423 (shown in FIG. 4), and a drain electrode 425 (shown in FIG. 4). The gate electrode 421 is electrically connected to the first scan line G1. The source electrode 423 is electrically connected to the data line Dn. The first liquid crystal capacitor C3 includes two ends (a and b). The first storage capacitor C4 includes two ends (c and d). The drain electrode 425 is electrically connected to the end a of the first liquid crystal capacitor C3 and the end c of the first storage capacitor C4.

In the present embodiment, the data line Dn transmits a signal to the first thin film transistor M1. The common line Ln transmits a signal to the first thin film transistor M1. The first scan line G1 controls the first thin film transistor M1 to receive the data signal. Thus, charging and discharging of the first liquid crystal capacitor C3 are controlled. The first storage capacitor C4 is used to maintain a potential difference between two ends of the first liquid crystal capacitor C3 to prevent current leakage from the first liquid crystal capacitor C3.

In FIG. 2, the second sub-pixel 44 includes a second thin film transistor M2, a second sub-pixel electrode 442 (shown in FIG. 4), a second liquid crystal capacitor C5, and a second storage capacitor C6. The second thin film transistor M2 includes a gate electrode 441 (shown in FIG. 4), a source electrode 443 (shown in FIG. 4), and a drain electrode 445 (shown in FIG. 4). The gate electrode 441 is electrically connected to the second scan line G2. The source electrode 443 is electrically connected to the data line Dn. The second liquid crystal capacitor C5 includes two ends (e and f). The second storage capacitor C6 includes two ends (g and h). The drain electrode 445 is electrically connected to the end e of the second liquid crystal capacitor and the end g of the second storage capacitor.

In this embodiment, the data line Dn transmits a signal to the second thin film transistor M2. The common line Ln transmits a signal to the second thin film transistor M2, and the second scan line G2 controls the second thin film transistor M2 to receive the data signal. Thus, charging and discharging of the second liquid crystal capacitor C5 are controlled. The second storage capacitor C6 is used to maintain a potential difference between two ends of the second liquid crystal capacitor C5 to prevent current leakage from the second liquid crystal capacitor C5.

Figure 3:
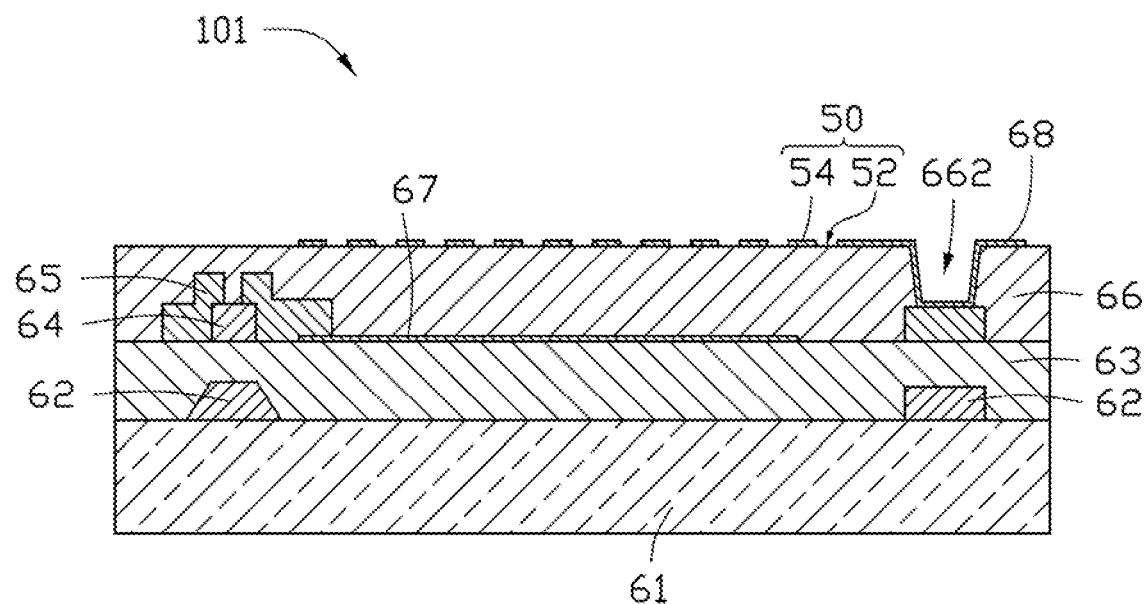
FIG. 3 is a cross-sectional view showing the thin film transistor array substrate of FIG. 2.

Referring to FIGS. 2 and 3, the thin film transistor array substrate 101 includes a substrate 61, a first conductive layer 62, an insulating layer 63, a first electrode layer 67, a semiconductor layer 64, a second conductive layer 65, a protective layer 66, and a second electrode layer 68.

In the present embodiment, the substrate 61 includes components of the thin film transistor array substrate 101 on the substrate 61. The substrate 61 may be transparent, and made of materials such as glass, transparent plastic, or the like.

Referring to FIGS. 3 and 4, in the present embodiment, the first conductive layer 62 defines the gate electrode 421 of the first thin film transistor M1, the gate electrode 441 of the second thin film transistor M2, the first scan line G1, and the second scan line G2. In the present embodiment, the formation of the first conductive layer 62 also forms connection lines connecting the first scan line G1 to the gate electrode 421 and connection lines connecting the second scan line G2 to the gate electrode 441.

In FIG. 3, the insulating layer 63 covering the first conductive layer 62 is formed on a side of the first conductive layer 62 away from the substrate 61. The insulating layer 63 serves as a gate insulating layer of the first thin film transistor M1 and the second thin film transistor M2.

The first electrode layer 67 is formed on a side of the insulating layer 63 away from the substrate 61. The first electrode layer 67 forms the first sub-pixel electrode 422 (shown in FIG. 4) and the second sub-pixel electrode 442 (shown in FIG. 4).

The semiconductor layer 64 is formed on a region of the insulating layer 63 without the first electrode layer 67. The second conductive layer 65 is formed on a side of the semiconductor layer 64 away from the substrate 61, a side of the insulating layer 63 away from the substrate 61, and a side of the first electrode layer 67 away from the substrate 61. The second conductive layer 65 forms the source electrode 423 of the first thin film transistor M1, the drain electrode 425 of the first thin film transistor M1, the source electrode 443 of the second thin film transistor M2, the drain electrode 445 of the second thin film transistor M2, the common lines L1-Ln, and the data lines D1-Dn.

In the present embodiment, the source electrode 423 and the drain electrode 425 are located above the gate electrode 421 of the first thin film transistor M1. The source electrode 443 and the drain electrode 445 of the first thin film transistor M2 are located above the gate electrode 441 of the second thin film transistor M2. The semiconductor layer 64 is located below the source electrode 423 and the drain electrode 425 and also below the source electrode 443 and the drain electrode 445 of the second thin film transistor M2.

In FIG. 4, the source electrode 423 and the source electrode 443 are electrically connected to the data line Dn. The drain electrode 425 is electrically connected to the first sub-pixel electrode 422. The drain electrode 445 is electrically connected to the second sub-pixel electrode 442. The first thin film transistor M1 and the second thin film transistor M2 are on opposite sides of the data line Dn. The first thin film transistor 442 and the second thin film transistor M2 are on opposite sides of the first scan line G1 and the second scan line G2. The common line Ln is between two adjacent data lines D(n−1)-Dn.

In FIG. 3, the semiconductor layer 64 and the second conductive layer 65 are covered by a protective layer 66. The protective layer 66 defines a via hole 662 to couple the common line Ln to the common electrode 50.

The protective layer 66 covers the semiconductor layer 64 and the second conductive layer 65.

The second electrode layer 68 is formed on a side of the protective layer 66 away from the substrate 61, and the second electrode layer 68 forms the common electrode 50. The common electrode 50 is on opposite sides of both the first sub-pixel electrode 422 and the second sub-pixel electrode 442. The common electrode 50 is electrically connected to the common line Ln by the via hole 662, and the common line Ln sends signals to the common electrode 50.

In the present embodiment, the material of the protective layer 66 and the insulating layer 63 may be silicon nitride or other insulating materials. The material of the first electrode layer 67 and the second electrode layer 68 may be Indium Tin Oxide (ITO) or other various conductive materials which are also transparent.

Slits 52 are defined in the common electrode 50 corresponding to the first sub-pixel electrode 422 and the second sub-pixel electrode 442 to form common electrode strips 54. A parallel electric field is formed between the common electrode strips 54 and the first sub-pixel electrode 422 and is also formed between the common electrode strips 54 and the second sub-pixel electrode 442. The liquid crystal molecules in the liquid crystal layer 103 are thus driven to rotate.

Referring to both FIGS. 2 and 4, the common electrode strips 54 are arranged to be substantially parallel to the common line Ln and the data line Dn, and are substantially perpendicular to the scan lines 10. In the present embodiment, the common electrode strips 54 are arranged at substantially equal intervals, but are not limited thereto.

In FIGS. 3 and 4, the common electrode 50 is formed with a slit 52 that is not corresponding to the common electrode line Ln. The common electrode 50 is electrically connected to the common electrode line Ln by the via hole 662 in the protective layer 66.

In FIG. 2, the common line Ln is perpendicular to, and crosses, one pair of scan lines 10. A first parasitic capacitance C1 is formed between each common line Ln and each first scan line G1. A second parasitic capacitance C2 is formed between each common line Ln and each second scan line G2.

In FIG. 4, the common line Ln includes bridges 36. Each bridge 36 crosses one pair of scan lines 10, e.g., first scan line G1 and second scan line G2, and each bridge 36 overlaps with a portion of one scan line 10 extending along the second direction Y. The projection of each bridge 36 on the substrate 61 overlaps with projections of both the first scan line G1 and the second scan line G2 on the substrate 61.

In the present embodiment, the portion of the first scan line G1 that overlaps with the bridge 36 is equal in size to the area in which the second scan line G2 overlaps with the bridge 36. Even when there is a deviation between the first conductive layer 62 and the second conductive layer 65, the value of the first parasitic capacitance C1 always equal to the value of the second parasitic capacitance C2 in each pixel unit 40.

In the present embodiment, a size of the common line Ln in the first direction X is defined as a line width of the common line Ln. A size of the first scan line G1 along the second direction Y is defined as a line width of the first scan line G1. A size of the second scan line G2 in the second direction Y is defined as a line width of the second scan line G2.

In FIG. 4, a line width of the common electrode line Ln when crossing one scan lines 10 is greater than a line width of other portions of the common line Ln. A line width of the portion of the first scan line G1 that overlaps with the bridge 36 is less than a line width of other portions of the first scan line G1. A line width of the portion of the second scan line G2 that overlaps with the bridge 36 is less than a line width of other portions of the second scan line G2. Thus, the size of the bridge 36 in the second direction Y can be reduced.

Referring to FIG. 2, the display panel 100 operates as follows. In a row of pixel units 40, the gate electrodes 421 of the first thin film transistors M1 of all the first sub-pixels 42 are electrically connected to one first scan line G1. When a sufficiently large positive voltage is applied to the first scan line G1, the first thin film transistors M1 electrically connected to the first scan line G1 are turned on. At this time, the first sub-pixel electrodes 422 on the first scan line G1 are electrically connected to the adjacent data line Dn, and data signals are applied by the data line Dn. The first sub-pixel electrodes 422 on the first scan line G1 are thereby charged to an appropriate voltage. At this time, a parallel electric field is formed between the first sub-pixel electrode 422 and the opposite common electrode 50 to rotate the liquid crystal molecules in the liquid crystal layer 103.

Then, a sufficiently large negative voltage is applied to the first scan line G1, and the first thin film transistors M1 electrically connected to the first scan line G1 are turned off. In the meantime, the charge is stored on the first liquid crystal capacitor C3.

Then, the second scan line G2 is activated, and the second thin film transistors M2 electrically connected to the second scan line G2 are turned on. The second sub-pixel electrodes 442 on the second scan line G2 are electrically connected to the adjacent data line Dn, and the data signals are applied by the data line Dn to the the second scan lines G2. The second sub-pixel electrodes 442 are charged to an appropriate voltage. At this time, a parallel electric field is formed between the second sub-pixel electrodes 442 and the opposite common electrode 50 to rotate the liquid crystal molecules in the liquid crystal layer 103.

In the present embodiment, the portion of the first scan line G1 that overlaps with the bridge 36 is equal to the portion of the second scan line G2 that overlaps with the bridge 36. Thus, the value of the first parasitic capacitance C1 between each first scan line G1 and the bridge 36 is equal to the value of the second parasitic capacitance C2 between each second scan line G2 and the bridge 36. Thus, the charging rate of the first sub-pixel electrodes 422 on one scan line G1 is substantially the same as the charging rate of the second sub-pixel electrodes 442 on the second scan line G2. The resistance-capacitance phenomenon caused by the common line Ln does not occur and light and dark streaks, caused by the differences in brightness of two adjacent columns in the display image, are absent. The display quality of the display panel 100 is improved.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A thin film transistor array substrate, comprising:
   a substrate;
   a first conductive layer on the substrate, the first conductive layer defining a plurality of scan line pairs, each of the plurality of scan line pairs comprising a first scan line and a second scan line both extending in a first direction;
   a second conductive layer on a side of the first conductive layer away from the substrate, the second conductive layer defining a plurality of data lines and a plurality of common lines both extending in a second direction intersecting with the first direction, the plurality of data lines and the plurality of common lines alternately arranged in the first direction; and
   a plurality of pixel units, each of the plurality of the pixel units being between two adjacent common lines, each of the plurality of the pixel units comprising a first sub-pixel and a second sub-pixel on opposite sides of one of the plurality of scan line pairs, the first sub-pixel electrically connected to the first scan line, the second sub-pixel electrically connected to the second scan line, the first sub-pixel and the second sub-pixel on opposite sides of and electrically connected to one of the plurality of data lines;
   wherein each of the plurality of common lines comprises a plurality of bridges, each of the plurality of bridges crosses one of the plurality of scan line pairs;
   a projection of each of the plurality of bridges on the substrate overlaps with projections of both the first scan line and the second scan line on the substrate, and an area of a portion of the first scan line that overlaps with the bridge equals to an area of a portion of the second scan line that overlaps with the bridge;
   each of the plurality of bridges completely overlaps with a portion of one of the plurality of scan line pairs extending in the second direction.

2. The thin film transistor array substrate of claim 1, wherein a line width of the portion of the first scan line that overlaps with the bridge is less than a line width of other portion of the first scan line, and a line width of the portion of the second scan line that overlaps with the bridge is less than a line width of other portion of the second scan line.

3. The thin film transistor array substrate of claim 1, wherein a line width of a portion of the common line crossing one pair of the plurality of scan line pairs is greater than a line width of other portion of the common line.

4. The thin film transistor array substrate of claim 1, the first sub-pixel comprises a first sub-pixel electrode, the second sub-pixel comprises a second sub-pixel electrode, and the thin film transistor array substrate further comprises a common electrode on opposite sides of both the first sub-pixel electrode and the second sub-pixel electrode, wherein a plurality of slits are defined in the common electrode; such that a parallel electric field is formed between the common electrode and the first sub-pixel electrode and formed between the common electrode and the second sub-pixel electrode.

5. The thin film transistor array substrate of claim 4, wherein the first sub-pixel further comprises a first thin film transistor, and the second sub-pixel further comprises a second thin film transistor, the first thin film transistor and the second thin film transistor each comprise a gate electrode, a source electrode, and a drain electrode;

the gate electrode of the first thin film transistor is electrically connected to the first scan line, the source electrode of the first thin film transistor is electrically connected to one of the plurality of data lines, and the drain electrode of the first thin film transistor is electrically connected to the first sub-pixel electrode;

the gate electrode of the second thin film transistor is electrically connected to the second scan line, the source electrode of the second thin film transistor is electrically connected to one of the plurality of data lines, and the drain electrode of the second thin film transistor is electrically connected to the second sub-pixel electrode.

6. The thin film transistor array substrate of claim 5, wherein the gate electrode of the first thin film transistor and the gate electrode of the second thin film transistor are formed by the first conductive layer;

the source electrode of the first thin film transistor, the drain electrode of the first thin film transistor, the source electrode of the second thin film transistor, and the drain electrode of the second thin film transistor are formed by the second conductive layer.

7. The thin film transistor array substrate of claim 6 further comprising: an insulating layer; wherein the insulating layer is on a side of the first conductive layer away from the substrate.

8. The thin film transistor array substrate of claim 7 further comprising: a semiconductor layer; wherein the semiconductor layer is between the insulating layer and the second conductive layer.

9. The thin film transistor array substrate of claim 8 further comprising: a protective layer; wherein the semiconductor layer and the second conductive layer are covered by the protective layer, and the protective layer defines a via hole coupling the common line to the common electrode.

10. The thin film transistor array substrate of claim 9, wherein the common electrode is on a side of the protective layer away from the substrate, and the common electrode is electrically connected to the common line by the via hole.

11. A display panel, comprising a color filter substrate, a thin film transistor array substrate, and a liquid crystal layer between the color filter substrate and the thin film transistor array substrate, the thin film transistor array substrate comprising:

a substrate;

a first conductive layer on the substrate, the first conductive layer defining a plurality of scan line pairs, each of the plurality of scan line pairs comprising a first scan line and a second scan line both extending in a first direction;

a second conductive layer on a side of the first conductive layer away from the substrate, the second conductive layer defining a plurality of data lines and a plurality of common lines both extending in a second direction intersecting with the first direction, the plurality of data lines and the plurality of common lines alternately arranged in the first direction; and a plurality of pixel units, each of the plurality of the pixel units being between adjacent two of the plurality of common lines, each of the plurality of the pixel units comprising a first sub-pixel and a second sub-pixel located on opposite sides of one of the plurality of scan line pairs, the first sub-pixel electrically connected to the first scan line, the second sub-pixel electrically connected to the second scan line, the first sub-pixel and the second sub-pixel located on opposite sides of and electrically connected to one of the plurality of data lines;

wherein each of the plurality of common lines comprises a plurality of bridges, each of the plurality of bridges crosses one of the plurality of scan line pairs;

a projection of each of the plurality of bridges on the substrate overlaps with projections of both the first scan line and the second scan line on the substrate, and an area of a portion of the first scan line that overlaps with the bridge equals to an area of a portion of the second scan line that overlaps with the bridge;

each of the plurality of bridges completely overlaps with a portion of one of the plurality of scan line pairs extending in the second direction.

12. The display panel of claim 11, wherein a line width of the portion of the first scan line that overlaps with the bridge is less than a line width of other portion of the first scan line, and a line width of the portion of the second scan line that overlaps with the bridge is less than a line width of other portion of the second scan line.

13. The display panel of claim 11, wherein a line width of a portion of the common line crossing one pair of the plurality of scan line pairs is greater than a line width of other portion of the common line.

14. The display panel of claim 11, the first sub-pixel comprises a first sub-pixel electrode, the second sub-pixel comprises a second sub-pixel electrode, and the thin film transistor array substrate further comprises a common electrode located opposite to the first sub-pixel electrode and the second sub-pixel electrode, wherein a plurality of slits are defined in the common electrode; such that a parallel electric field is formed between the common electrode and the first sub-pixel electrode and formed between the common electrode and the second sub-pixel electrode.

15. The display panel of claim 14, wherein the first sub-pixel further comprises a first thin film transistor, and the second sub-pixel further comprises a second thin film transistor, the first thin film transistor and the second thin film transistor each comprise a gate electrode, a source electrode, and a drain electrode;

the gate electrode of the first thin film transistor is electrically connected to the first scan line, the source electrode of the first thin film transistor is electrically connected to one of the plurality of data lines, and the drain electrode of the first thin film transistor is electrically connected to the first sub-pixel electrode;

the gate electrode of the second thin film transistor is electrically connected to the second scan line, the source electrode of the second thin film transistor is electrically connected to one of the plurality of data lines, and the drain electrode of the second thin film transistor is electrically connected to the second sub-pixel electrode.

16. The display panel of claim 15, wherein the gate electrode of the first thin film transistor and the gate electrode of the second thin film transistor are formed by the first conductive layer;

the source electrode of the first thin film transistor, the drain electrode of the first thin film transistor, the source electrode of the second thin film transistor, and the drain electrode of the second thin film transistor are formed by the second conductive layer.

17. The display panel of claim 16, wherein further comprises an insulating layer, and the insulating layer is located on a side of the first conductive layer away from the substrate.

18. The display panel of claim 17, wherein further comprises a semiconductor layer, and the semiconductor layer is between the insulating layer and the second conductive layer.

19. The display panel of claim 18, wherein further comprises a protective layer, the semiconductor layer and the second conductive layer are covered by the protective layer, and the protective layer defines a via hole to couple the common line to the common electrode.

20. The display panel of claim 19, wherein the common electrode is located on a side of the protective layer away from the substrate, and the common electrode is electrically connected to the common line by the via hole.

\* \* \* \* \*